(12) United States Patent
Nomiyama et al.

(10) Patent No.: US 11,339,325 B2
(45) Date of Patent: May 24, 2022

(54) PHOSPHOR PARTICLE, COMPOSITE, LIGHT-EMITTING DEVICE, AND METHOD FOR PRODUCING PHOSPHOR PARTICLE

(71) Applicant: DENKA COMPANY LIMITED, Tokyo (JP)

(72) Inventors: Tomohiro Nomiyama, Tokyo (JP); Yusuke Takeda, Tokyo (JP); Marina Takamura, Tokyo (JP); Tatsuya Okuzono, Tokyo (JP); Masaru Miyazaki, Tokyo (JP); Shintaro Watanabe, Tokyo (JP)

(73) Assignee: DENKA COMPANY LIMITED, Tokyo (JP)

( * ) Notice: Subject to any disclaimer, the term of this patent is extended or adjusted under 35 U.S.C. 154(b) by 0 days.

(21) Appl. No.: 17/599,651

(22) PCT Filed: Mar. 24, 2020

(86) PCT No.: PCT/JP2020/013097
§ 371 (c)(1),
(2) Date: Sep. 29, 2021

(87) PCT Pub. No.: WO2020/203483
PCT Pub. Date: Oct. 8, 2020

(65) Prior Publication Data
US 2022/0089947 A1    Mar. 24, 2022

(30) Foreign Application Priority Data

Mar. 29, 2019    (JP) .............................. JP2019-069104

(51) Int. Cl.
*H01J 1/62*      (2006.01)
*C09K 11/78*    (2006.01)
(Continued)

(52) U.S. Cl.
CPC ........ *C09K 11/77348* (2021.01); *C01F 17/34* (2020.01); *H01L 33/502* (2013.01);
(Continued)

(58) Field of Classification Search
CPC ..................... C09K 11/77348; H01L 33/502
See application file for complete search history.

(56) References Cited

U.S. PATENT DOCUMENTS 8,404,152 B2    3/2013    Emoto et al.
9,464,226 B2    10/2016    Sakata et al.
(Continued)

FOREIGN PATENT DOCUMENTS

EP    2666841 A1    11/2013
JP    2009-096882 A    5/2009
(Continued)

OTHER PUBLICATIONS

Jun. 9, 2020 International Search Report issued in International Patent Application No. PCT/JP2020/013097.
(Continued)

*Primary Examiner* — Tracie Y Green
(74) *Attorney, Agent, or Firm* — Oliff PLC

(57) ABSTRACT

An α-sialon phosphor particle containing Eu. At least one slit is formed on a surface of the α-sialon phosphor particle. The α-sialon phosphor particle is preferably produced by undergoing a raw material mixing step, a heating step, a pulverizing step, and an acid treatment step.

15 Claims, 9 Drawing Sheets

(51) Int. Cl.
*C09K 11/54* (2006.01)
*C09K 11/77* (2006.01)
*H01L 33/50* (2010.01)
*C01F 17/34* (2020.01)

(52) U.S. Cl.
CPC ...... *C01P 2004/03* (2013.01); *C01P 2004/61* (2013.01); *C01P 2006/60* (2013.01)

(56) References Cited

U.S. PATENT DOCUMENTS

| | | | |
|---|---|---|---|
| 9,570,655 | B2 | 2/2017 | Yoshimura et al. |
| 9,711,686 | B2 | 7/2017 | Yoshimura et al. |
| 10,266,766 | B2 | 4/2019 | Emoto |
| 2009/0021141 | A1 | 1/2009 | Emoto et al. |
| 2009/0243467 | A1* | 10/2009 | Shimizu ............. C09K 11/7734 313/503 |
| 2010/0053932 | A1 | 3/2010 | Emoto et al. |
| 2011/0133629 | A1 | 6/2011 | Sakata et al. |
| 2012/0261703 | A1* | 10/2012 | Zimmerman ......... H01L 33/641 257/98 |
| 2013/0285104 | A1 | 10/2013 | Yoshimura et al. |
| 2014/0197362 | A1 | 7/2014 | Industries Ltd |
| 2014/0299902 | A1* | 10/2014 | Zimmerman ........... H01L 33/62 257/98 |
| 2016/0204311 | A1 | 7/2016 | Yoshimura et al. |
| 2016/0280994 | A1 | 9/2016 | Emoto |

FOREIGN PATENT DOCUMENTS

| | | | |
|---|---|---|---|
| WO | WO-2008032812 A1 * | 3/2008 | ......... C09K 11/7734 |
| WO | 2008/062781 A1 | 5/2008 | |
| WO | 2010/018873 A1 | 2/2010 | |
| WO | 2011/013564 A1 | 2/2011 | |
| WO | 2012/098932 A1 | 7/2012 | |
| WO | 2014/077240 A1 | 5/2014 | |

OTHER PUBLICATIONS

Feb. 11, 2022 Office Action issued in German Patent Application No. 11 2020 001 645.5.
Jan. 30, 2022 Search Report issued in Chinese Patent Application No. 202080025133.8.

* cited by examiner (a)

(b)

PHOSPHOR PARTICLE, COMPOSITE, LIGHT-EMITTING DEVICE, AND METHOD FOR PRODUCING PHOSPHOR PARTICLE

TECHNICAL FIELD

The present invention relates to a phosphor particle, a composite, a light-emitting device, and a method for producing the phosphor particle.

BACKGROUND ART

As nitride and oxynitride phosphors, an α-sialon phosphor in which a specific rare earth element is activated is known to have useful fluorescence characteristics, and has been applied to a white LED and the like. The α-sialon phosphor has a structure in which Si—N bonds of α-silicon nitride crystals are partially substituted with Al—N bonds and Al—O bonds, and specific elements (Ca, Li, Mg, Y, or lanthanide metals except for La and Ce) penetrate into crystal lattices and are solid-dissolved in order to maintain electrical neutrality. The fluorescence characteristics are expressed by using some of the elements that penetrate into the lattices and are solid-dissolved as a rare earth element serving as a luminescent center. Among those, the α-sialon phosphor, in which Ca is solid-dissolved and the elements are partially substituted with Eu, is relatively efficiently excited in a wide wavelength range from ultraviolet to blue light and exhibits emission of yellow to orange light. As an attempt to further improve the fluorescence characteristics of such an α-sialon phosphor, for example, it has been proposed to select an α-sialon phosphor having a specific average particle diameter by a classification treatment (Patent Document 1).

RELATED DOCUMENT

Patent Document

[Patent Document 1] Japanese Laid-open Patent Publication No. 2009-96882

SUMMARY OF THE INVENTION

Technical Problem

The present inventors have conducted intensive studies on an improvement of the fluorescence characteristics of an α-sialon phosphor, and have thus found that the fluorescence characteristics of the α-sialon phosphor vary depending on the surface shape of an α-sialon phosphor particle. Furthermore, as a result of a progress in the studies on what kind of surface shape contributes to the fluorescence characteristics of the α-sialon phosphor, the present invention has been completed.

The present invention has been made in view of such circumstances. The present invention provides a technique for further improving the fluorescence characteristics of the α-sialon phosphor particle.

Solution to Problem

According to the present invention, there are provided a phosphor particle which is an α-sialon phosphor particle containing Eu, in which at least one slit is formed on a surface of the α-sialon phosphor particle.

Furthermore, according to the present invention, there is provided a composite including the above-mentioned phosphor particles and a sealing material that seals the phosphor particles.

In addition, according to the present invention, there is provided a light-emitting device including a light-emitting element that emits excitation light, and the above-mentioned composite which increases a wavelength of the excitation light.

Furthermore, according to the present invention, there is provided a method for producing the above-mentioned phosphor particle, the method including a mixing step of mixing raw materials containing an element constituting an α-sialon phosphor particle containing Eu, a heating step of heating a mixture of the raw materials to obtain an α-sialon phosphor, a pulverizing step of pulverizing the α-sialon phosphor obtained by the heating step to obtain the α-sialon phosphor particle, and a step of subjecting the α-sialon phosphor particle obtained by the pulverizing step to an acid treatment to form a slit on a surface of the α-sialon phosphor particle.

Advantageous Effects of Invention

According to the present invention, the fluorescence characteristics of an α-sialon phosphor particle can be improved.

DESCRIPTION OF EMBODIMENTS

Figure 1:
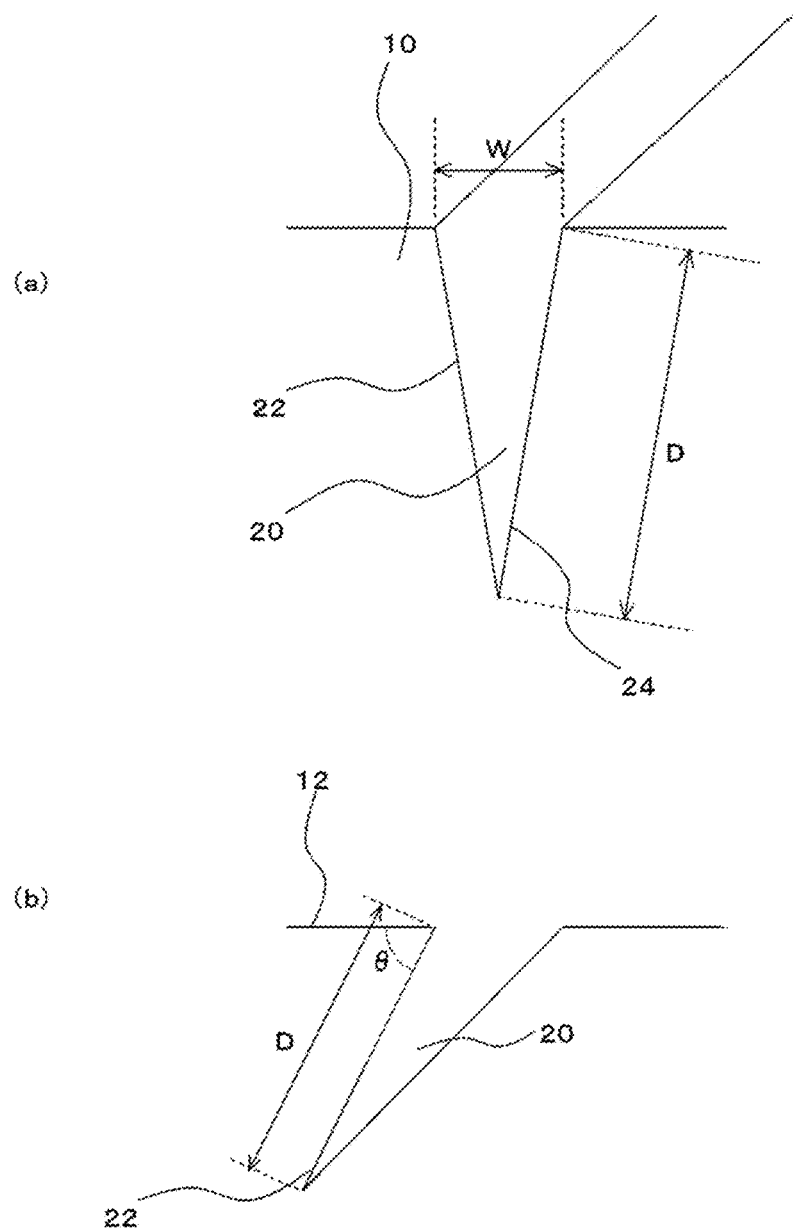
FIG. 1(a) is a schematic view of a slit provided on the surface of an α-sialon phosphor particle.
FIG. 1(b) is a schematic view of a slit in a case where the slit has an oblique V-shaped cross-section.

Hereinafter, embodiments of the present invention will be described in detail.

The phosphor particle according to an embodiment is formed of an α-sialon phosphor particle containing Eu as an activating substance. At least one slit is formed on the surface of the α-sialon phosphor particle.

Here, the slit is a groove-shaped recess formed on the surface of the α-sialon phosphor particle, indicating that in a cross-section orthogonal to the extending direction of the recess (hereinafter in a case where a "cross-section" is simply mentioned, it refers to a cross-section orthogonal to the extending direction of a slit which is a groove-shaped recess), the width is narrower as the depth of the recess is deeper, and the deepest portion thereof remains inside the α-sialon phosphor particle.

With the α-sialon phosphor particle of the present embodiment, it is possible to improve the fluorescence characteristics while maintaining the excitation wavelength range and the fluorescence wavelength range of an α-sialon phosphor particle in the related art. Therefore, as a result, the light emission characteristics of a light-emitting device using the α-sialon phosphor particle can be improved.

Detailed mechanism as a reason therefor is not clear but, for example, a slit formed on the surface of the α-sialon phosphor particle may be a recess structure which is characteristic as a trace of removal of a heterogeneous phase that does not contribute to fluorescence. It is presumed that in the α-sialon phosphor particle on which such a slit is formed, a heterogeneous phase which does not contribute to fluorescence is extensively removed even on the surface of the α-sialon phosphor particle other than the slit. As a result, it is considered that the fluorescence characteristics of the α-sialon phosphor particle are improved by increasing the proportion of mother crystals of a phosphor which contributes to fluorescence on the surface of the α-sialon phosphor particle.

In addition to this, it is considered that light incident in the slit is taken into the inside of the α-sialon phosphor particle and efficiently taken out therefrom, and as a result, the fluorescence characteristics of the α-sialon phosphor particle are improved.

(α-Sialon Phosphor Particle)

The α-sialon phosphor particle containing Eu is formed of an α-sialon phosphor which will be described below.

The α-sialon phosphor is an α-sialon phosphor containing an Eu element, represented by General Formula: $(M1_x, M2_y, Eu_z)(Si_{12-(m+n)}Al_{m+n})(O_nN_{16-n})$ (provided that M1 is a monovalent Li element and M2 are one or more divalent elements selected from the group consisting of Mg, Ca, and lanthanide elements (except for La and Ce)).

The solid dissolution composition of the α-sialon phosphor is expressed in x, y, and z in the general formula, and m and n determined by an Si/Al ratio and an O/N ratio associated therewith, and satisfies $0 \leq x < 2.0$, $0 \leq y < 2.0$, $0 < z \leq 0.5$, $0 < x+y$, $0.3 \leq x+y+z \leq 2.0$, $0 < m \leq 4.0$, and $0 < n \leq 3.0$.

In particular, in a case where Ca is used as M2, the α-sialon phosphor is stabilized in a wide composition range. In particular, by partially substituting the elements of Ca with Eu which is a luminescent center, excitation occurs by light in a wide wavelength range from ultraviolet to blue light, whereby a phosphor exhibiting emission of visible light ranging from yellow to orange light can be obtained.

From the viewpoint of obtaining light in bulb color in illumination applications, it is preferable that the α-sialon phosphor does not include Li as a solid dissolution composition, or includes a small amount of L, if any. In terms of the general formula, it is preferable to satisfy $0 \leq x \leq 0.1$. Furthermore or alternatively, a ratio of Li in the α-sialon phosphor particles is preferably equal to or more than 0% by mass and equal to or less than 1% by mass.

In general, the α-sialon phosphor has a second crystal phase different from that of the α-sialon phosphor or an amorphous phase which is inevitably present, the solid dissolution composition cannot be strictly defined by composition analysis or the like. As a crystal phase of the α-sialon phosphor, an α-sialon single phase is preferable, and the α-sialon phosphor may also include aluminum nitride or a polytypoid or the like thereof as another crystal phase.

In the α-sialon phosphor particles, a plurality of equi-axed primary particles are sintered to form aggregated secondary particles. The primary particles in the present embodiment refer to the smallest particles observable with an electron microscope or the like, in which the particles can exist singly.

The lower limit of the average particle diameter of the α-sialon phosphor particles is preferably equal to or more than 1 μm, more preferably equal to or more than 5 μm, and still more preferably equal to or more than 10 μm. In addition, the upper limit of the average particle diameter of the α-sialon phosphor particles is preferably equal to or less than 30 μm, and more preferably equal to or less than 20 μm. The average particle diameter of the α-sialon phosphor particles is a dimension for the secondary particles. By setting the average particle diameter of the α-sialon phosphor particles to equal to or more than 5 μm, the transparency of a composite which will be described later can be further enhanced. On the other hand, by setting the average particle diameter of the α-sialon phosphor particles to equal to or less than 30 μm, it is possible to suppress the occurrence of chipping in a case where the composite is cut with a dicer or the like.

Here, the average particle diameter of the α-sialon phosphor particles means a median diameter ($D_{50}$) in a volume-based integrated fraction, determined by a laser diffraction scattering method in accordance with JIS R1629: 1997.

The shape of the α-sialon phosphor particle is not particularly limited. Examples of the shape include a spherical shape, a cubic shape, a columnar shape, and an amorphous shape.

(Slit Formed on Surface of α-Sialon Phosphor Particle)

At least one slit is formed on the surface of the α-sialon phosphor particle. The presence or absence of a slit on the surface of the α-sialon phosphor particle can be confirmed by, for example, a scanning electron microscope (SEM). In addition, the cross-sectional shape and the dimension of the slit can be confirmed by cutting the α-sialon phosphor particle so that the cross-section orthogonal to or intersecting the extending direction of the slit is exposed, and observing the obtained cross-section with SEM. A method for cutting the α-sialon phosphor particle is not particularly limited. Examples of the method include a cross-section polisher (CP) processing based on an ion milling method.

FIG. 1(a) is a schematic view of a slit provided on the surface of an α-sialon phosphor particle. As shown in FIG. 1(a), a slit 20 is a cut formed on the surface of an α-sialon phosphor particle 10 or a groove-shaped recess provided on the surface of the α-sialon phosphor particle.

A width W of the slit 20 is the opening width of the slit 20 on the surface of the α-sialon phosphor particle 10 in a direction orthogonal to the extending direction or the longitudinal direction of the slit 20. The width W of the slit 20 refers to the width of the surface of the α-sialon phosphor particle 10 in a case of being viewed from the vertical direction of the surface. The width W of the slit 20 may vary from place to place in a specific slit 20. In at least one cross-section of a region including the slit 20, the lower limit of the width W is preferably equal to or more than 50 nm, more preferably equal to or more than 100 nm, and still more preferably equal to or more than 150 nm. In addition, the upper limit of the width W is preferably equal to or less than 500 nm, more preferably equal to or less than 450 nm, and still more preferably equal to or less than 400 nm.

In at least one cross-section of the region including the slit 20, by setting the lower limit of the width W of the slit 20 to the range, it is possible to further improve the fluorescence characteristics of the α-sialon phosphor particle 10.

In addition, by setting the upper limit of the width W of the slit 20 to the range, it is possible to further improve the fluorescence characteristics of the α-sialon phosphor particle 10 while maintaining the intensity of the α-sialon phosphor particle 10.

A depth D of the slit 20 is a length from the surface of the α-sialon phosphor particle 10 to the bottom of the slit 20. That is, a length from the edge of the wall to the bottom of the slit is defined as the depth D of the slit 20. Incidentally, in a case where the heights of the left and right walls are different in FIG. 1(a), that is, in a case where there is a step on the surface portion, a length from the edge of the higher wall to the bottom of the slit is defined as the depth D of the slit 20.

The depth D of the slit 20 may vary from place to place in the specific slit 20.

In at least one cross-section of a region including the slit 20, the lower limit of the depth D of the slit 20 is preferably equal to or more than 200 nm, more preferably equal to or more than 250 nm, and still more preferably equal to or more than 300 nm. On the other hand, the upper limit of the depth D of the slit 20 is preferably equal to or less than 1,500 nm, more preferably equal to or less than 1,400 nm, and still more preferably equal to or less than 1,300 nm.

In at least one cross-section of the region including the slit 20, by setting the lower limit of the depth D to the range, it is possible to further improve the fluorescence characteristics of the α-sialon phosphor particle 10.

In addition, by setting the upper limit of the depth D of the slit 20 to the range, it is possible to further improve the fluorescence characteristics of the α-sialon phosphor particle 10 while maintaining the intensity of the α-sialon phosphor particle 10.

As shown in FIG. 1(a), the slit 20 preferably has a V-shaped cross-sectional portion formed of two surfaces of a wall 22 and a wall 24 in a cross-section orthogonal to the extending direction of the slit 20.

It is considered that the V-shaped cross-sectional portion formed by the slit 20 is generated in a case where a heterogeneous phase that does not contribute to fluorescence is removed from the surface of the α-sialon phosphor particle 10 to a higher degree. Therefore, it is considered that it is possible to further improve the fluorescence characteristics of the α-sialon phosphor particle 10 by inclusion of the slit 20 having a V-shaped cross-sectional portion.

FIG. 1(b) is a schematic view of a slit 20 in a case where the slit 20 has an oblique V-shaped cross-section. As shown in FIG. 1(b), in the cross-section of the slit 20, an angle θ formed between a wall 22 that forms the slit 20 and a surface 12 of the α-sialon phosphor particle is an acute angle. The angle θ is preferably equal to or less than 80 degrees.

It is considered that by adjusting the angle θ to an acute angle, in other words, adjusting the shape of the cross-section of the slit 20 to an obliquely inclined V-shape, the light incident in the slit 20 is taken into the inside of the α-sialon phosphor particle 10 and efficiently taken out therefrom, and as a result, it is possible to further improve the fluorescence characteristics of the α-sialon phosphor particle 10.

As shown in FIG. 1(b), in a case where the angle θ is an acute angle, the depth D of the slit 20 is defined by a distance from an intersection of the wall 22 that forms the angle θ and the surface 12 of the α-sialon phosphor particle 10 in the slit 20 to the deepest part.

(Note that in the case of the slit of FIG. 1(a), the length from an edge of the "higher wall" out of the two surfaces of the walls to the bottom of the slit is defined as D, which does not apply to D in the slit of FIG. 1(b).)

A plurality of slits 20 may be formed on the surface of a specific α-sialon phosphor particle 10. It is considered that the plurality of slits 20 formed on the surface of the α-sialon phosphor particle 10 are generated in a case where a heterogeneous phase that does not contribute to fluorescence is removed from the surface of the α-sialon phosphor particle 10 to a higher degree. Therefore, it is considered that the fluorescence characteristics of the α-sialon phosphor particle 10 having the plurality of slits 20 on the surface are further improved. In addition, since the presence of the plurality of slits 20 can increase the amount of light incident on the entire slit 20, so that the amount of light taken into the inside of the α-sialon phosphor particle 10 and taken out therefrom in the slit 20 can be increased, and thus, the fluorescence characteristics of the α-sialon phosphor particle 10 can be further enhanced.

In this case, the extending direction of the plurality of slits 20 is not limited. The extending directions may be parallel to or different from each other. Further, the plurality of slits 20 may be separated from or intersect with each other. In addition, the plurality of slits 20 may extend radially around the junction.

Figure 2:
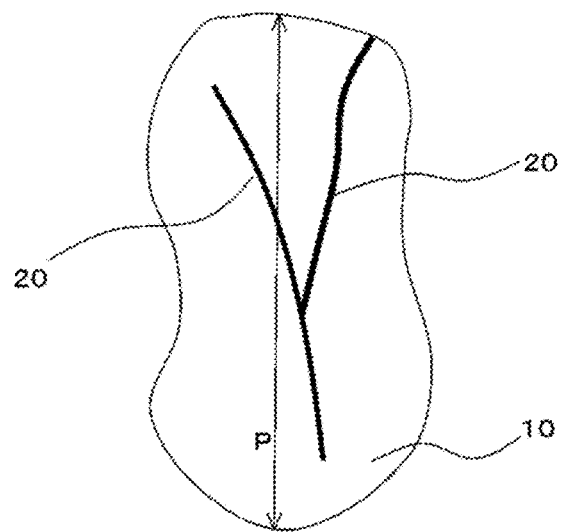
FIG. 2 is a view showing the maximum diameter of an α-sialon phosphor particle in a case of being viewed in a plan view.

As shown in FIG. 2, a maximum diameter of the α-sialon phosphor particle 10 in a case of being seen in a plan view is defined as P. In a case where a total path length along the slit 20 is defined as L, it is preferable to satisfy L>P. Accordingly, by further increasing the amount of light incident on and taken out from the slit 20, the amount of light taken into and taken out from the inside of the α-sialon phosphor particle 10 in the slit 20 can be further increased. As a result, the fluorescence characteristics of the α-sialon phosphor particle 10 can be further enhanced.

Figure 3:
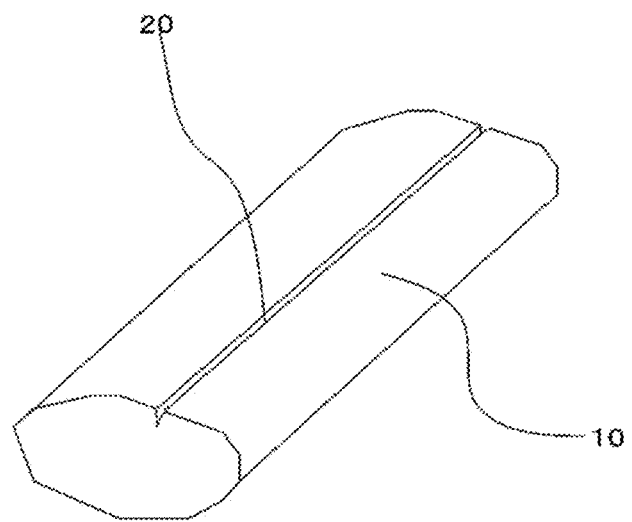
FIG. 3 is a schematic view showing one aspect of the slit.

FIG. 3 is a schematic view of a case where the α-sialon phosphor particle 10 is a columnar body. As shown in FIG. 3, in a case where the α-sialon phosphor particle 10 is a columnar body, the slit 20 preferably extends from one end to the other end of a side surface of the columnar body along an axial direction of the columnar body. Accordingly, by increasing the total path length of the slit 20 and further increasing the amount of light incident on and taken out from the slit 20, the amount of light taken into the inside of the α-sialon phosphor particle 10 in the slit 20 can be further increased. As a result, the fluorescence characteristics of the α-sialon phosphor particle 10 can be further enhanced.

Figure 4:
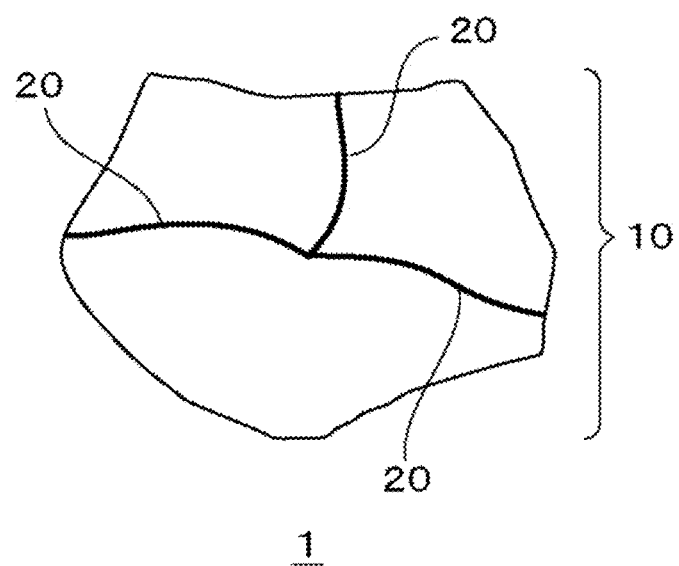
FIG. 4 is a schematic view showing another aspect of the slit.

FIG. 4 is a schematic view showing another aspect of the slit. The α-sialon phosphor particle 10 shown in FIG. 4 has a plurality of slits extending radially around a junction. According to such an embodiment, by increasing the total path length of the slit 20 and further increasing the amount of light incident on and taken out from the slit 20, the amount of light taken into and taken out from the inside of the α-sialon phosphor particle 10 in the slit 20 can be further increased. As a result, the fluorescence characteristics of the α-sialon phosphor particle 10 can be further enhanced. The α-sialon phosphor particle 10 may be formed of a plurality of crystal grains, and the slit 20 may be formed between the adjacent crystal grains.

According to the phosphor particles described above, the fluorescence characteristics can be improved by inclusion of the slit 20 on the particle surface. In addition, the phosphor powder including the phosphor particles (having slits)

described above has the above-mentioned action and effect, that is, the action and effect of improving the fluorescence characteristics.

(Method for Producing Phosphor Particle)

A method for producing the α-sialon phosphor particle of the present embodiment will be described. In the α-sialon phosphor particle, a part of a raw material powder mainly undergoes a reaction to form a liquid phase, and each of the elements moves through the liquid phase in the synthesis process, whereby formation of a solid solution and grain growth proceed.

First, the raw materials including an element constituting the α-sialon phosphor particle containing Eu are mixed. Calcium is solid-dissolved at a high concentration in the α-sialon phosphor particles having a low oxygen content, which have been synthesized using calcium nitride as a calcium raw material. In particular, in a case where the Ca solid dissolution concentration is high, it is possible to obtain a phosphor having a light emission peak wavelength on a higher wavelength side (equal to or more than 590 nm, more specifically equal to or more than 590 nm and equal to or less than 610 nm, and still more specifically equal to or more than 592 nm and equal to or less than 608 nm) than that of a composition in the related art, using an oxide raw material. Specifically, in the general formula, it is preferable to satisfy $1.5<x+y+z\leq 2.0$. It is also possible to finely tune the emission spectrum by partially substituting the elements of Ca with Li, Mg, Sr, Ba, Y, and lanthanide elements (except for La and Ce).

Examples of a raw material powder other than those include silicon nitride, aluminum nitride, and an Eu compound. Examples of the Eu compound include europium oxide, a compound that turns into europium oxide after heating, and europium nitride. Europium nitride, which can reduce the amount of oxygen in the system, is preferable.

In a case where an appropriate amount of the α-sialon phosphor particles previously synthesized is added to a raw material powder, this addition can serve as a base point of the grain growth to obtain α-sialon phosphor particles having relatively short-axis diameters, and the particle shapes can be controlled by changing the forms of the α-sialon particles to be added.

Examples of a method of mixing the above-mentioned respective raw materials include a dry mixing method and a method in which wet mixing is performed in an inert solvent that does not substantially react with the respective components of the raw materials, and then the solvent is removed. Examples of a mixing device include a V type mixer, a rocking mixer, a ball mill, and a vibrating mill. Mixing of calcium nitride which is unstable in the atmosphere is preferably performed in a glove box in an inert atmosphere since the hydrolysis and the oxidation of the substance give an influence on the characteristics of a synthetic product.

A container made of a material having a low reactivity with a raw material and a phosphor to be synthesized, for example, a container made of boron nitride is filled with a powder obtained by mixing (hereinafter simply referred to as a raw material powder). Then, the powder is heated for a predetermined time in a nitrogen atmosphere. In this manner, an α-sialon phosphor can be obtained. A temperature for the heat treatment is preferably equal to or higher than 1,650° C. and equal to or lower than 1,950° C.

By setting the temperature for the heat treatment to equal to or higher than 1,650° C., it is possible to reduce the amount of residual unreacted products and make the primary particles sufficiently grow. In addition, by setting the temperature during the heat treatment to equal to or lower than 1,950° C., remarkable sintering between particles can be suppressed.

From the viewpoint of suppressing sintering between the particles during the heating, it is preferable that the container is filled with an increased volume of the raw material powder. Specifically, it is preferable that a bulk density at the time of filling the raw material powder in the container is set to equal to or less than 0.6 g/cm$^3$.

The heating time for the heat treatment is preferably equal to or more than 2 hours and equal to or less than 24 hours in terms of a time range during which there are no inconveniences such as presence of a large amount of unreacted substances, insufficient growth of primary particles, and sintering between the particles.

In the above-mentioned step, an α-sialon phosphor having an ingot-shaped outer form is produced. By subjecting this ingot-shaped α-sialon phosphor to a pulverizing step in which the phosphor is pulverized by a pulverizer such as a crusher, a mortar pulverizer, a ball mill, a vibrating mill, and a jet mill, and a sieve classification step after such the pulverizing treatment, it is possible to obtain a powder formed of α-sialon phosphor particles having an adjusted $D_{50}$ particle diameter of secondary particles. In addition, it is possible to adjust the $D_{50}$ particle diameter of the secondary particles by performing a step in which the phosphor powder is dispersed in an aqueous solution to remove the secondary particles which have small particle diameters and are hardly settled.

The α-sialon phosphor particle according to the present embodiment can be prepared by carrying out the above-mentioned steps and then carrying out an acid treatment step.

In the acid treatment step, for example, the α-sialon phosphor particle is immersed in an acidic aqueous solution. Examples of the acidic aqueous solution include an acidic aqueous solution including one kind of acid selected from acids such as hydrofluoric acid, nitric acid, and hydrochloric acid, and an aqueous mixed acid solution obtained by mixing two or more kinds of the acids. Among these, an aqueous hydrofluoric acid solution including hydrofluoric acid alone and an aqueous mixed acid solution obtained by mixing hydrofluoric acid and nitric acid are more preferable. The stock solution concentration of the acidic aqueous solution is appropriately set depending on the strength of an acid used, but is, for example, preferably equal to or more than 0.7% and equal to or less than 100%, and more preferably equal to or more than 0.7% and equal to or less than 40%. In addition, a temperature at which the acid treatment is carried out is preferably equal to or higher than 60° C. and equal to or lower than 90° C., and the reaction time (immersion time) is preferably equal to or more than 15 minutes and equal to or less than 80 minutes.

By performing the stirring at a high speed, the acid treatment on the particle surface is likely to be sufficiently performed. The term "high speed" as used herein depends on a stirring device used, but in a case where a laboratory-level magnetic stirrer is used, the stirring speed is, for example, equal to or more than 400 rpm, and in reality, equal to or more than 400 rpm and equal to or less than 500 rpm. For a common purpose of the stirring, which is to constantly supply a new acid to the particle surface, a stirring speed of approximately 200 rpm is sufficient, but by performing the stirring at a high speed of equal to or more than 400 rpm, the particle surface is likely to be sufficiently treated due to a physical action in addition to a chemical action.

The number, the shape, and the length of slits formed on the surface of α-sialon phosphor particle can be controlled by optimally adjusting the stock solution concentration of an acidic aqueous solution used for an acid treatment, the temperature during the acid treatment, a reaction time, and the like. For example, by adopting conditions which approximate to a combination of the stock solution concentration of an acidic aqueous solution used in Examples, a temperature during an acid treatment, and a reaction time, with reference to abundant Examples which will be described below, thus to carry out the acid treatment, it is possible to form a slit having a desired number, a desired shape, and a desired length on the surface of the α-sialon phosphor particle.

(Composite)

The composite according to an embodiment includes the above-mentioned phosphor particles and a sealing material that seals the phosphor particles. In the composite according to the present embodiment, a plurality of the above-mentioned phosphor particles are dispersed in the sealing material. As the sealing material, a well-known material such as a resin, a glass, and ceramics can be used. Examples of the resin used for the sealing material include transparent resins such as a silicone resin, an epoxy resin, and a urethane resin.

Examples of a method for manufacturing the composite include a manufacturing method in which a powder formed of α-sialon phosphor particles of the present embodiment is added to a liquid resin, a powdered glass, or ceramics, and the mixture is mixed uniformly, and then cured or sintered by a heat treatment.

(Light-Emitting Device)

Figure 5:
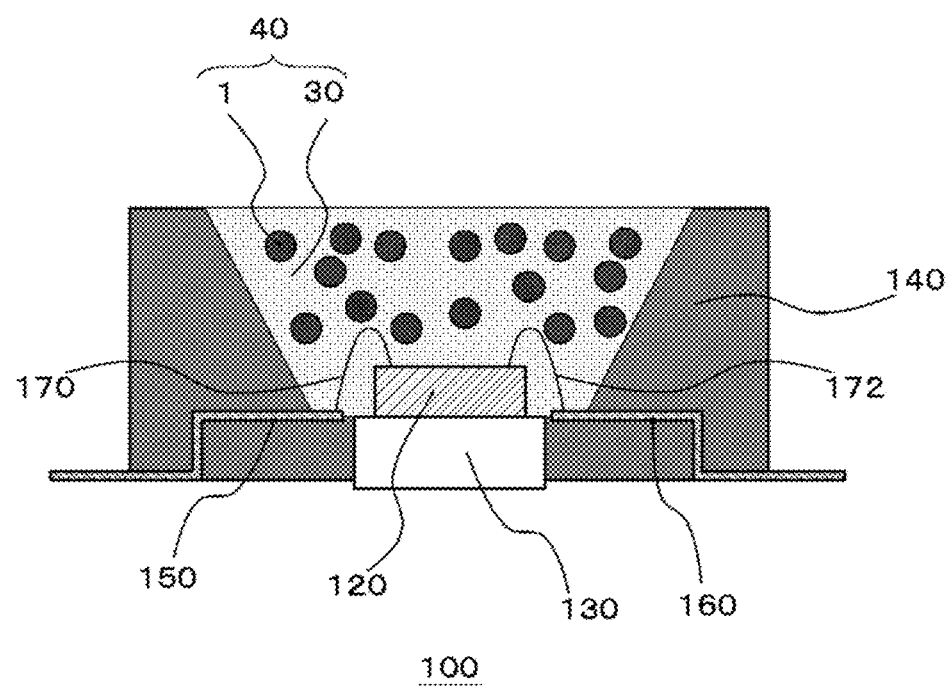
FIG. 5 is a schematic cross-sectional view showing a structure of a light-emitting device according to an embodiment.

FIG. 5 is a schematic cross-sectional view showing a structure of a light-emitting device according to the present embodiment. As shown in FIG. 5, a light-emitting device 100 includes a light-emitting element 120, a heat sink 130, a case 140, a first lead frame 150, a second lead frame 160, a bonding wire 170, a bonding wire 172, and a composite 40.

The light-emitting element 120 is mounted in a predetermined region on the upper surface of the heat sink 130. By mounting the light-emitting element 120 on the heat sink 130, the heat dissipation of the light-emitting element 120 can be enhanced. Further, a packaging substrate may be used instead of the heat sink 130.

The light-emitting element 120 is a semiconductor element that emits excitation light. As the light-emitting element 120, for example, an LED chip that generates light at a wavelength of equal to or more than 300 nm and equal to or less than 500 nm, corresponding to near-ultraviolet to blue light, can be used. One electrode (not shown in the drawings) arranged on the upper surface side of the light-emitting element 120 is connected to the surface of the first lead frame 150 through the bonding wire 170 such as a gold wire. In addition, the other electrode (not shown in the drawings) formed on the upper surface of the light-emitting element 120 is connected to the surface of the second lead frame 160 through the bonding wire 172 such as a gold wire.

In the case 140, a substantially funnel-shaped recess whose hole diameter gradually increases toward the upside from the bottom surface is formed. The light-emitting element 120 is provided on the bottom surface of the recess. The wall surface of the recess surrounding the light-emitting element 120 serves as a reflective plate.

The recess whose wall surface is formed by the case 140 is filled with the composite 40. The composite 40 is a wavelength conversion member that increases the wavelength of excitation light emitted from the light-emitting element 120. The composite of the present embodiment is used as the composite 40, and the phosphor particles 1 of the present embodiment in a sealing material 30 such as a resin are dispersed. The light-emitting device 100 emits a mixed color of light of the light-emitting element 120 and light generated from the phosphor particles 1 that are excited by absorbing the light of the light-emitting element 120. The light-emitting device 100 preferably emits white light by the mixed color of the light of the light-emitting element 120 and the light generated from the phosphor particles 1.

In the light-emitting device 100 of the present embodiment, by using an α-sialon phosphor particle having a slit formed on the surface thereof as the phosphor particle 1 as mentioned above, the fluorescence characteristics of the phosphor particle 1 and the composite 40 can be improved, and an improvement of the light emission intensity of the light-emitting device 100 can be promoted.

FIG. 5 illustrates a surface mounting type light-emitting device. However, the light-emitting device is not limited to the surface mounting type. The light-emitting device may be of a cannonball type, a chip-on-board (COB) type, or a chip-scale-package (CSP) type.

The embodiments of the present invention have been described above, but these are examples of the present invention and various configurations other than the examples can also be adopted.

EXAMPLES

Hereinafter, the present invention will be described with reference to Examples and Comparative Examples, but the present invention is not limited thereto.

Example 1

In a glove box, 62.4 parts by mass of a silicon nitride powder (manufactured by Ube Kosan Co., Ltd., E10 grade), 22.5 parts by mass of an aluminum nitride powder (manufactured by Tokuyama Corporation, E grade), 2.2 parts by mass of an europium oxide powder (manufactured by Shin-Etsu Chemical Co., Ltd., RU grade), and 12.9 parts by mass of a calcium nitride powder (manufactured by Kojundo Chemical Lab. Co., Ltd.) were used as a blend composition of a raw material powder, and the raw material powders were dry-blended and then passed through a nylon-made sieve having a mesh size of 250 μm to obtain a raw material mixed powder. A cylindrical boron nitride-made container (manufactured by Denka Co., Ltd., N-1 grade) with a lid, having an internal volume of 0.4 liters, was filled with 120 g of the raw material mixed powder.

This raw material mixed powder was subjected to a heat treatment at 1,800° C. for 16 hours in a nitrogen atmosphere at an atmospheric pressure in an electric furnace of a carbon heater together with a container. Since calcium nitride included in the raw material mixed powder was easily hydrolyzed in the air, the boron nitride-made container filled with the raw material mixed powder was immediately set in the electric furnace rapidly after being taken out from the glove box, and immediately evacuated to a vacuum to prevent a reaction of calcium nitride.

The synthetic product was lightly crushed in a mortar and completely passed through a sieve having a mesh size of 150 μm to obtain a phosphor powder. With regard to this phosphor powder, the crystal phase was examined by powder X-ray diffraction measurement (X-ray Diffraction, hereinafter referred to as XRD measurement) using CuKα rays, the existing crystal phase was a Ca-α-sialon (α-sialon including Ca) containing an Eu element.

Next, 50 ml of 50% hydrofluoric acid and 50 ml of 70% nitric acid were mixed to obtain a mixed stock solution. 300 ml of distilled water was added to the mixed stock solution, and the concentration of the mixed stock solution was diluted to 25% to prepare 400 ml of an aqueous mixed acid solution. 30 g of a powder formed of the above-mentioned α-sialon phosphor particles was added to the aqueous mixed acid solution, the temperature of the aqueous mixed acid solution was kept at 80° C., and the mixture was subjected to an acid treatment in which the mixture was immersed for 60 minutes under stirring at a rotation speed of 450 rpm using a magnetic stirrer. The powder after the acid treatment was thoroughly washed with distilled water, filtered, dried, and then passed through a sieve having a mesh size of 45 μm to prepare a powder formed of the α-sialon phosphor particles of Example 1.

Example 2

A powder formed of α-sialon phosphor particles of Example 2 was manufactured by the same procedure as in Example 1, except that an aqueous mixed acid solution having a stock solution concentration of 1.0% was prepared by adding 396 ml of distilled water to a mixed stock solution obtained by mixing 3.2 ml of 50% hydrofluoric acid and 0.8 ml of 70% nitric acid, instead of the aqueous mixed acid solution used in Example 1, and the phosphor powder was immersed for 30 minutes while maintaining the temperature of the aqueous mixed acid solution at 80° C.

Example 3

A powder formed of α-sialon phosphor particles of Example 3 was manufactured by the same procedure as in Example 1, except that an aqueous mixed acid solution having a stock solution concentration of 1.0% was prepared by adding 396 ml of distilled water to a mixed stock solution obtained by mixing 1.2 ml of 50% hydrofluoric acid and 2.8 ml of 70% nitric acid, instead of the aqueous mixed acid solution used in Example 1, and the phosphor powder was immersed for 30 minutes while maintaining the temperature of the aqueous mixed acid solution at 80° C.

Example 4

A powder formed of α-sialon phosphor particles of Example 4 was manufactured by the same procedure as in Example 1, except that an aqueous mixed acid solution having a stock solution concentration of 1.0% was prepared by adding 396 ml of distilled water to a mixed stock solution obtained by mixing 2.0 ml of 50% hydrofluoric acid and 2.0 ml of 70% nitric acid, instead of the aqueous mixed acid solution used in Example 1, and the phosphor powder was immersed for 30 minutes while maintaining the temperature of the aqueous mixed acid solution at 80° C.

Example 5

A phosphor powder formed of α-sialon phosphor particles of Example 5 was manufactured by the same procedure as in Example 1, except that an aqueous hydrofluoric acid solution having a stock solution concentration of 25% was prepared by adding 300 ml of distilled water to 100 ml of 50% hydrofluoric acid (stock solution), instead of the aqueous mixed acid solution used in Example 1, and the phosphor powder was immersed for 30 minutes while the temperature of the acid aqueous solution was kept at 80° C.

Comparative Example 1

A powder formed of α-sialon phosphor particles of Comparative Example 1 was manufactured by the same procedure as in Example 1, except that an aqueous mixed acid solution having a stock solution concentration of 0.5% was used by adding 398 ml of distilled water to a mixed stock solution obtained by mixing 1.0 ml of 50% hydrofluoric acid and 1.0 ml of 70% nitric acid, instead of the aqueous mixed acid solution used in Example 1, the temperature of the aqueous mixed acid solution was kept at 80° C., and the mixture was subjected to an acid treatment in which the aqueous mixed acid solution was immersed for 30 minutes under stirring at a rotation speed of 300 rpm using a magnetic stirrer.

In the method for manufacturing a powder formed of the α-sialon phosphor particles of Comparative Example 1, the stock solution concentration of the aqueous mixed acid solution used for the acid treatment was set to a level used in the related art.

(Evaluation of Characteristics)
[Light Emission Characteristics]

With regard to each of the obtained powders formed of α-sialon phosphor particles, the absorption rate, the internal quantum efficiency, and the external quantum efficiency were measured by a spectrophotometer (MCPD-7000 manufactured by Otsuka Electronics Co., Ltd.) and calculated by the following procedure.

A powder formed of the α-sialon phosphor particles of Examples or Comparative Example was filled so that the surface of a recess cell was smooth, and an integrating sphere was attached. Monochromatic light spectrally split into a wavelength of 455 nm from a light emission source (Xe lamp) was introduced into the integrating sphere using an optical fiber. A sample of the phosphor was irradiated with the monochromatic light as an excitation source, and measurement of the fluorescence spectrum of the sample was performed.

A standard reflective plate (Spectralon manufactured by Labsphere Inc.) having a reflectance of 99% was attached to a sample unit, and the spectrum of excitation light at a wavelength of 455 nm was measured. At that time, the number (Qex) of excitation light photons was calculated from a spectrum in the wavelength range of equal to or more than 450 nm and equal to or less than 465 nm.

A powder formed of the α-sialon phosphor particles was attached to the sample unit, and the number (Qref) of reflected excitation light photons and the number (Qem) of fluorescent light photons were calculated from the obtained spectral data. The number of reflected excitation light photons was calculated in the same wavelength range as the number of excitation light photons, and the number of fluorescent light photons was calculated in the range of equal to or more than 465 nm and equal to or less than 800 nm.

Absorption rate=$(Q\text{ex}-Q\text{ref})/Q\text{ex}\times 100$

Internal quantum efficiency=$(Q\text{em}/(Q\text{ex}-Q\text{ref}))\times 100$

External quantum efficiency=$(Q\text{em}/Q\text{ex})\times 100$

In a case where the standard sample NSG1301 sold by Sialon Co., Ltd. was measured using the measurement method, the external quantum efficiency was 55.6% and the internal quantum efficiency was 74.8%. The device was calibrated using this sample as a standard.

Incidentally, the peak wavelengths of the emission spectra of the powders formed of the α-sialon phosphor particles of Examples 1 to 5, obtained by the measurement (wavelength of irradiated light: 455 nm), are each 600 nm (relatively high wavelength).

[Measurement of Particle Size]

A particle size was measured by a laser diffraction scattering method based on JIS R1629: 1997, using Microtrac MT3300EX II (MicrotracBEL Corporation). 0.5 g of α-sialon phosphor particles were put into 100 cc of ion exchange water, the mixture was subjected to a dispersion treatment with Ultrasonic Homogenizer US-150E (Nissei Corporation, chip size: φ20 mm, Amplitude: 100%, oscillation frequency: 19.5 KHz, amplitude of vibration: about 31 μm) for 3 minutes, and then the particle size was measured with MT3300EX II. The median diameter $D_{50}$ was determined from the obtained particle size distribution.

[Confirmation of Slit]

Figure 6:
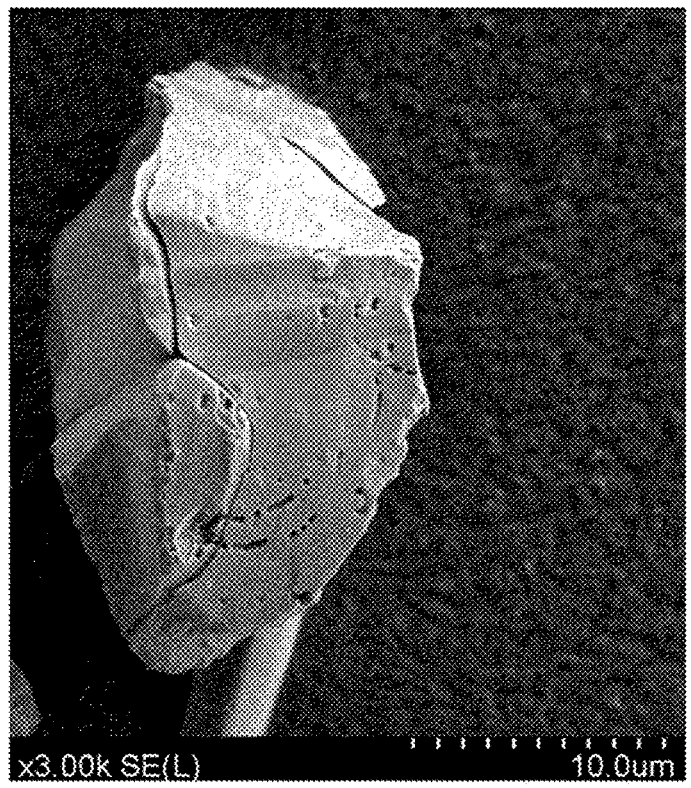
FIG. 6 is an SEM image of an α-sialon phosphor particle of Example 1.
Figure 6:
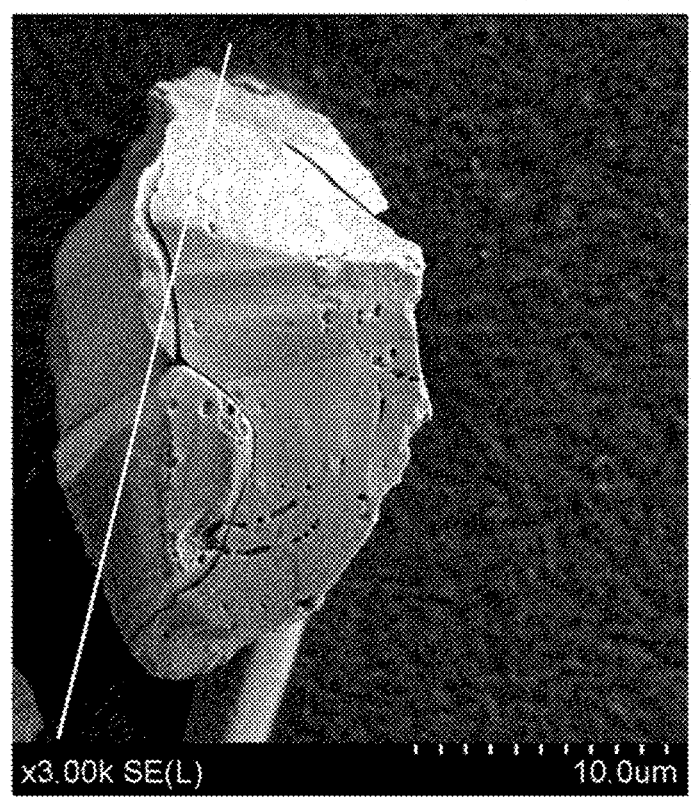

The surface of the α-sialon phosphor particle was observed with a scanning electron microscope (SEM). FIG. 6(a) is an SEM image of the α-sialon phosphor particle of Example 1. As shown in FIG. 6(a), it was confirmed that a plurality of slits were formed on the surface of the α-sialon phosphor particle in Example 1. The plurality of slits intersect with each other and extend radially around the intersection (junction).

Figure 8:
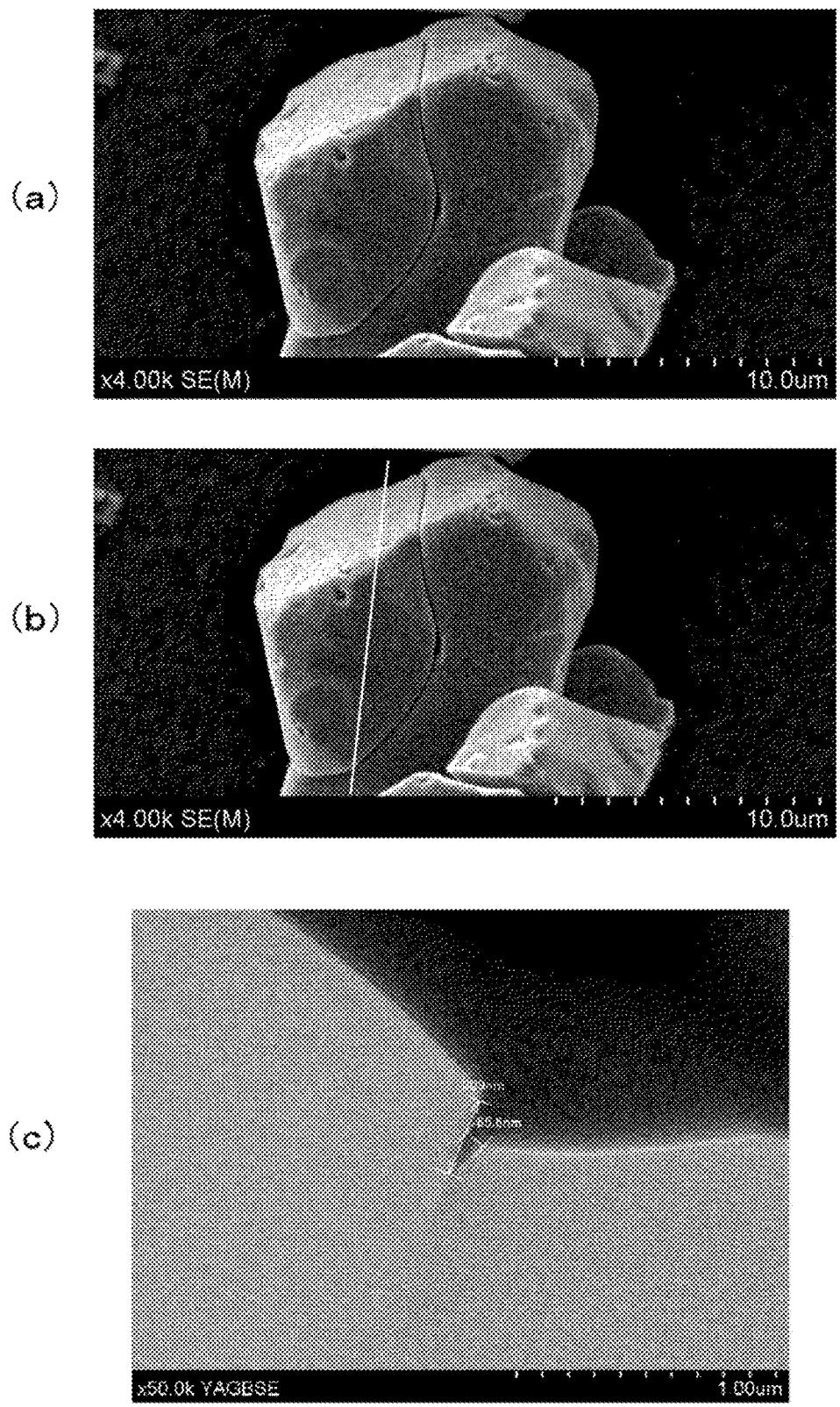
FIG. 8 is an SEM image of an α-sialon phosphor particle of Example 2 and an SEM image of a cross-section of the formed slit.

FIG. 8(a) is an SEM image of the α-sialon phosphor particle of Example 2. As shown in FIG. 8(a), the slit 20 is formed from one surface to the other surface of the particle in Example 2.

In Example 1 and Example 2, it was confirmed that α-sialon phosphor particles in which a total L of the path lengths along the plurality of slits is larger than a maximum diameter P in a case of being viewed in a plan view are present.

In addition, it was also confirmed that slits were formed on the surfaces of the α-sialon phosphor particles of Examples 3 to 5. In contrast, in Comparative Example 1, it was confirmed that no slit was present on the surface of the phosphor particle.

[Observation of Slit Cross-Section]

Figure 7A:
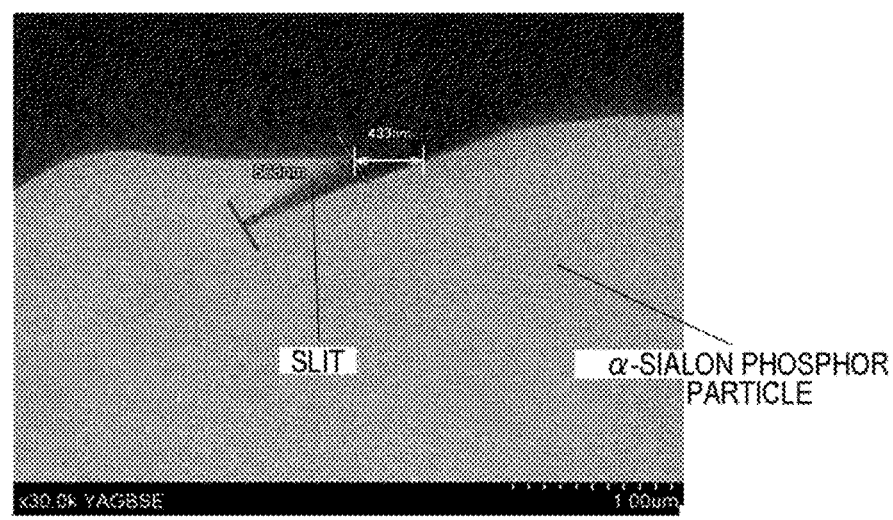
FIG. 7 is an SEM image of a cross-section of a slit formed in the α-sialon phosphor particle of Example 1.
Figure 7B:
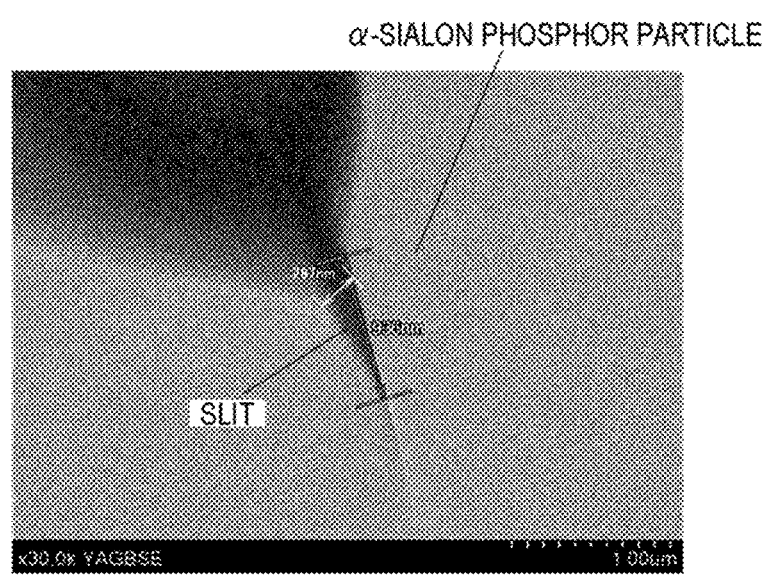

The α-sialon phosphor particle of Example 1 was cut by an ion milling device so that a cross-section intersecting the slit was generated. Specifically, the cutting process was carried out along the straight line shown in FIG. 6(b). The states of the cross-sections of the two obtained slits observed by SEM are shown in FIGS. 7(a) and 7(b). In one cross-section of the α-sialon phosphor particle of Example 1, the depth of the slit was 808 nm, and the width of the slit (the width in a case of being viewed from the vertical direction of the surface of the α-sialon phosphor particle) was 433 nm. Furthermore, the cross-sectional shape of the slit was a V-shape tilted obliquely. In addition, the slit was a V-shaped slit having a slit depth of 936 nm and a slit width of 267 nm in another cross-section.

Similarly, the α-sialon phosphor particle of Example 2 was cut by an ion milling device so that a cross-section intersecting the slit was generated. Specifically, the cutting process was carried out along the straight line shown in FIG. 8(b). With regard to the obtained cross-section, the state of the cross-section observed by SEM is shown in FIG. 8(c). With regard to one cross-section of the α-sialon phosphor particle of Example 2, a V-shaped slit having a slit depth of 309 nm and a slit width of 85.6 nm was observed.

In addition, with regard to the α-sialon phosphor particles of Examples 3 to 5, slits having V-shaped cross-sections were also observed.

TABLE 1

| | | | Example 1 | Example 2 | Example 3 | Example 4 | Example 5 | Comparative Example 1 |
|---|---|---|---|---|---|---|---|---|
| Acid treatment | Acid solution | 50% Hydrofluoric acid (ml) | 50 | 3.2 | 1.2 | 2.0 | 100 | 1.0 |
| | | 0% Nitric7acid (ml) | 50 | 0.8 | 2.8 | 2.0 | 0 | 1.0 |
| | | Liquid ratio (amount of hydrofluoric acid:amount of nitric acid) | 5:5 | 8:2 | 3:7 | 5:5 | 10:0 | 5:5 |
| | | Distilled water (ml) | 300 | 396 | 396 | 396 | 300 | 398 |
| | | Stock solution concentration (%) | 25 | 1.0 | 1.0 | 1.0 | 25 | 0.5 |
| | Reaction conditions | Temperature (° C.) | 80 | 80 | 80 | 80 | 80 | 80 |
| | | Time (min) | 60 | 30 | 30 | 30 | 30 | 30 |
| Particle size | | $D_{50}$ (μm) | 16.3 | 15.6 | 14.5 | 16.2 | 14.3 | 15.6 |
| Surface shape | | Presence or absence of slit | Present | Present | Present | Present | Present | Absent |
| Light emission characteristics | | Absorption rate (%) | 87.7 | 88.9 | 88.4 | 89.3 | 88.2 | 89.1 |
| | | Internal quantum efficiency (%) | 77.1 | 79.9 | 80.3 | 79.5 | 80.2 | 73.7 |
| | | External quantum efficiency (%) | 67.6 | 71.0 | 71.0 | 71.1 | 70.7 | 65.7 |

As shown in Table 1, it was confirmed that in each of the α-sialon phosphor particles of Examples 1 to 5, having a slit formed on the surface, both the internal quantum efficiency and the external quantum efficiency were higher than those of Comparative Example 1, and the fluorescence characteristics were improved.

Additional Comparative Example: Example in which Acid Treatment Condition was Changed in Example 3

α-sialon phosphor particles were obtained in the same manner as in Example 3, except that the stirring speed of the magnetic stirrer in the acid treatment was set from 450 rpm to 200 rpm which was a normal level.

Figure 9:
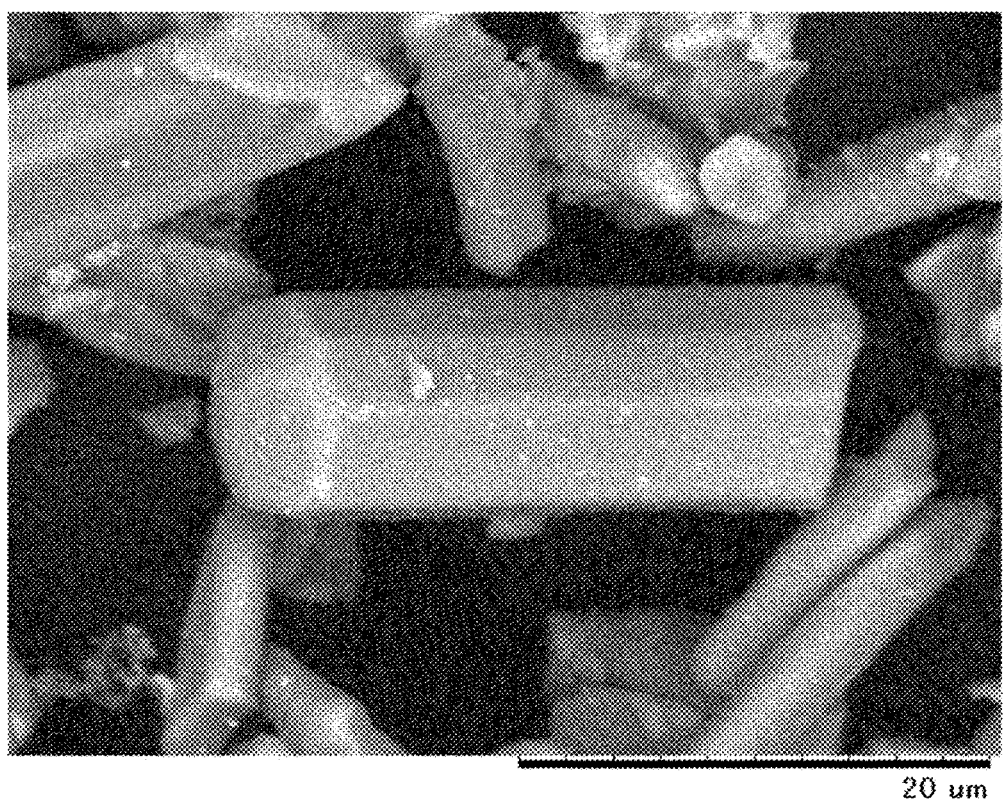
FIG. 9 is an SEM image of an α-sialon phosphor particle of Additional Comparative Example.
Figure 10:
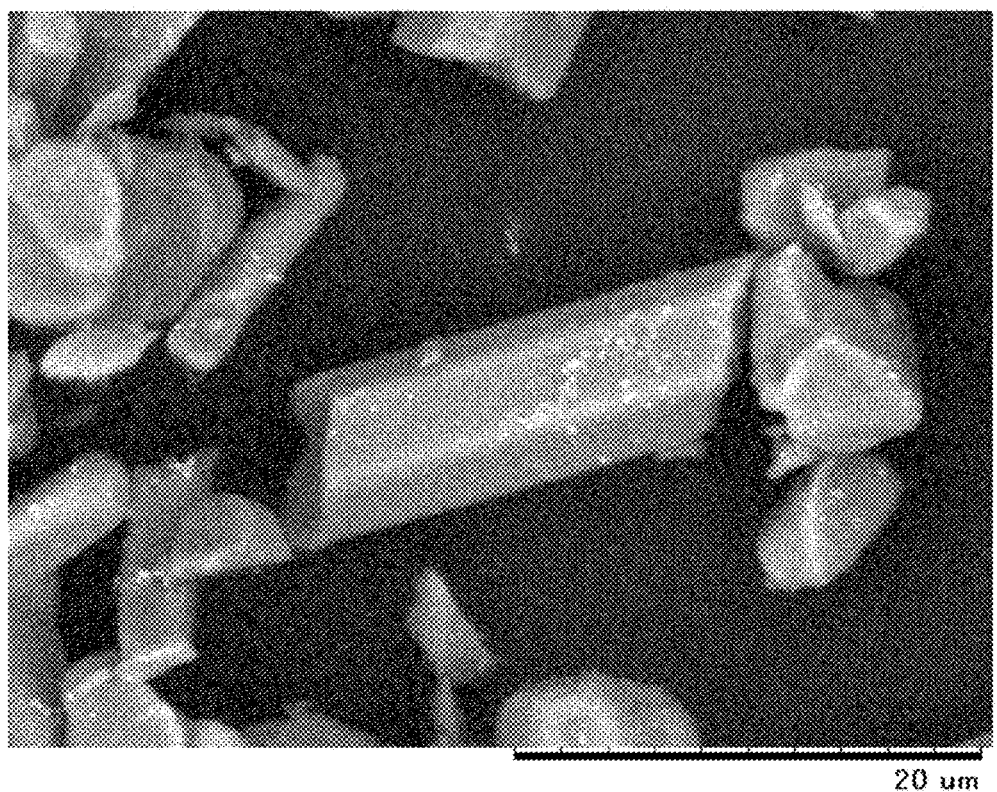
FIG. 10 is an SEM image of an α-sialon phosphor particle of Additional Comparative Example.

The median diameter D50 of the phosphor particles obtained in this Additional Comparative Example was 14.5 μm. Then, the obtained phosphor particles were observed by SEM in various fields of view, but there were no phosphor particles having slits formed on the surface thereof. For reference, the SEM images of the obtained phosphor particles are shown in FIGS. 9 and 10.

In addition, for the obtained phosphor particles, the internal quantum efficiency was 75.4%, and the external quantum efficiency was 66.6%, which were deteriorated in the level of Example 3 (and other Examples).

This application claims priority based on Japanese Application Japanese Patent Application No. 2019-069104 filed on Mar. 29, 2019, the disclosures of which are incorporated herein by reference in their entireties.

REFERENCE SIGNS LIST

1: phosphor particle
10: α-sialon phosphor particle
20: slit
30: sealing material
40: composite
100: light-emitting device
120: light-emitting element
130: heat sink
140: case
150: first lead frame
160: second lead frame
170: bonding wire
172: bonding wire

The invention claimed is:

1. An α-sialon phosphor particle containing Eu,
wherein at least one slit is formed on a surface of the α-sialon phosphor particle,
wherein a distance from the surface of the α-sialon phosphor particle to a bottom of the slit is equal to or more than 200 nm and equal to or less than 1,500 nm in at least one cross-section of the slit, and
wherein the α-sialon phosphor particle is formed of an α-sialon phosphor containing an Eu element, represented by General Formula: $(M1_x, M2_y, Eu_z)(Si_{12-(m+n)}Al_{m+n})(O_nN_{16-n})$ (provided that M1 is a monovalent Li element and M2 is a divalent Ca element), and in the general formula, $x=0$, $0<y<2.0$, $0<z\le0.5$, $0<x+y$, $0.3\le x+y+z\le2.0$, $0<m\le4.0$, and $0<n\le3.0$ are satisfied.

2. An α-sialon phosphor particle containing Eu,
wherein at least one slit is formed on a surface of the α-sialon phosphor particle,
wherein a width in a direction orthogonal to an extending direction of the slit is equal to or more than 50 nm and equal to or less than 500 nm with respect to an opening by the slit formed on the surface of the α-sialon phosphor particle in at least one cross-section of the slit, and
wherein the α-sialon phosphor particle is formed of an α-sialon phosphor containing an Eu element, represented by General Formula: $(M1_x, M2_y, Eu_z)(Si_{12-(m+n)}Al_{m+n})(O_nN_{16-n})$ (provided that M1 is a monovalent Li element and M2 is a divalent Ca element), and in the general formula, $x=0$, $0<y<2.0$, $0<z\le0.5$, $0<x+y$, $0.3\le x+y+z\le2.0$, $0<m\le4.0$, and $0<n\le3.0$ are satisfied.

3. An α-sialon phosphor particle containing Eu,
wherein at least one slit is formed on a surface of the α-sialon phosphor particle, wherein L>P is satisfied, where a maximum diameter of the α-sialon phosphor particle in a case of being viewed in a plan view is defined as P and a total path length along the slit is defined as L, and
wherein the α-sialon phosphor particle is formed of an α-sialon phosphor containing an Eu element, represented by General Formula: $(M1_x, M2_y, Eu_z)(Si_{12-(m+n)}Al_{m+n})(O_nN_{16-n})$ (provided that M1 is a monovalent Li element and M2 is a divalent Ca element), and in the general formula, $x=0$, $0<y<2.0$, $0<z\le0.5$, $0<x+y$, $0.3\le x+y+z\le2.0$, $0<m\le4.0$, and $0<n\le3.0$ are satisfied.

4. The phosphor particle according to claim 2, wherein a distance from the surface of the α-sialon phosphor particle to a bottom of the slit is equal to or more than 200 nm and equal to or less than 1,500 nm in at least one cross-section of the slit.

5. The phosphor particle according to claim 1, wherein a width in a direction orthogonal to an extending direction of the slit is equal to or more than 50 nm and equal to or less than 500 nm with respect to an opening by the slit formed on the surface of the α-sialon phosphor particle in at least one cross-section of the slit.

6. The phosphor particle according to claim 1, wherein L>P is satisfied, where a maximum diameter of the α-sialon phosphor particle in a case of being viewed in a plan view is defined as P and a total path length along the slit is defined as L.

7. The phosphor particle according to claim 1, wherein the slit has a V-shaped cross-sectional portion in a cross-section orthogonal to an extending direction of the slit.

8. The phosphor particle according to claim 1, wherein a plurality of slits are formed in the α-sialon phosphor particle.

9. The phosphor particle according to claim 8, wherein the particle has a plurality of slits separated from each other.

10. The phosphor particle according to claim 8, wherein the particle has a plurality of slits intersecting each other.

11. The phosphor particle according to claim 8, wherein the particle has a plurality of slits extending radially around a junction.

12. The phosphor particle according to claim 1, wherein the α-sialon phosphor particle is a columnar body, the slit extends from one end to the other end of a side surface of the columnar body along an axial direction of the columnar body.

13. A composite comprising:
the phosphor particles according to claim 1; and
a sealing material that seals the phosphor particles.

14. A light-emitting device comprising:
a light-emitting element that emits excitation light; and
the composite according to claim 13, which increases a wavelength of the excitation light.

15. A method for producing the phosphor particle according to claim 1, comprising:
mixing raw materials containing an element constituting an α-sialon phosphor particle containing Eu;
heating a mixture of the raw materials to obtain an α-sialon phosphor;
pulverizing the α-sialon phosphor obtained by the heating to obtain the α-sialon phosphor particle; and
subjecting the α-sialon phosphor particle obtained by the pulverization to an acid treatment to form a slit on a surface of the α-sialon phosphor particle.

* * * * *